(12) United States Patent
Pang et al.

(10) Patent No.: US 12,038,470 B2
(45) Date of Patent: Jul. 16, 2024

(54) TEST SYSTEM FOR MEMORY CARD

(71) Applicant: Huawei Technologies Co., Ltd., Shenzhen (CN)

(72) Inventors: Weiwen Pang, Shenzhen (CN); Xiaoqiang Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 311 days.

(21) Appl. No.: 17/418,576

(22) PCT Filed: Jul. 17, 2019

(86) PCT No.: PCT/CN2019/096429
§ 371 (c)(1),
(2) Date: Jun. 25, 2021

(87) PCT Pub. No.: WO2020/134034
PCT Pub. Date: Jul. 2, 2020

(65) Prior Publication Data
US 2022/0074986 A1   Mar. 10, 2022

(30) Foreign Application Priority Data
Dec. 26, 2018   (CN) .......................... 201811604369.8

(51) Int. Cl.
*G01R 31/28*    (2006.01)
*G01R 31/317*   (2006.01)
*G01R 31/3181*  (2006.01)

(52) U.S. Cl.
CPC ..... *G01R 31/2805* (2013.01); *G01R 31/2841* (2013.01); *G01R 31/2886* (2013.01); *G01R 31/31728* (2013.01); *G01R 31/31813* (2013.01)

(58) Field of Classification Search
None
See application file for complete search history.

(56) References Cited

U.S. PATENT DOCUMENTS 5,663,901 A * 9/1997 Wallace ................ G06F 13/385
                                              365/185.11
5,852,617 A * 12/1998 Mote, Jr. ............... G06F 11/221
                                              714/E11.161
(Continued)

FOREIGN PATENT DOCUMENTS

CN    101727989 A    6/2010
CN    103366830 A    10/2013
(Continued)

OTHER PUBLICATIONS

Translation of JP 2018-055748 A (Year: 2018).*

*Primary Examiner* — Jermele M Hollington
(74) *Attorney, Agent, or Firm* — Conley Rose, P.C.

(57) ABSTRACT

A test system for a memory card includes a first circuit board. One side of the first circuit board is provided with a plurality of contact groups spaced apart from each other along a row direction. Another side of the first circuit board is provided with slots disposed along the row direction. The test system further includes a second circuit board. The second circuit board is provided with a test circuit, and is inserted into the slot along a direction perpendicular to the first circuit board. The second circuit board provides a test signal to the contact groups.

20 Claims, 6 Drawing Sheets

(56) References Cited

U.S. PATENT DOCUMENTS

| | | | |
|---|---|---|---|
| 7,132,841 B1* | 11/2006 | Bertin | G11C 29/56016 |
| | | | 257/E21.526 |
| 2003/0080762 A1 | 5/2003 | Kim et al. | |
| 2005/0153465 A1* | 7/2005 | Wada | G11C 29/56016 |
| | | | 714/724 |
| 2007/0269911 A1 | 11/2007 | Co et al. | |
| 2008/0147950 A1* | 6/2008 | Chen | G11C 29/56 |
| | | | 710/305 |
| 2008/0252318 A1 | 10/2008 | Hopkins et al. | |
| 2009/0108859 A1 | 4/2009 | Teng et al. | |
| 2009/0153163 A1 | 6/2009 | Han et al. | |
| 2010/0213027 A1 | 8/2010 | Co et al. | |
| 2012/0126840 A1 | 5/2012 | Lee et al. | |
| 2018/0090218 A1* | 3/2018 | Takada | G11C 16/10 |
| 2022/0067475 A1* | 3/2022 | Deng | G06K 19/07733 |
| 2023/0053532 A1* | 2/2023 | Krishnamurthy | H04N 5/772 |

FOREIGN PATENT DOCUMENTS

| | | | | |
|---|---|---|---|---|
| CN | 104656003 A | | 5/2015 | |
| CN | 106887257 A | | 6/2017 | |
| EP | 3876156 A1 | * | 9/2021 | G06K 19/044 |
| JP | 2018055748 A | * | 4/2018 | G11C 11/5642 |
| KR | 20180067812 A | | 6/2018 | |

* cited by examiner

TEST SYSTEM FOR MEMORY CARD

CROSS-REFERENCE TO RELATED APPLICATIONS

This application is a National Stage of International Patent Application No. PCT/CN2019/096429 filed on Jul. 17, 2019, which claims priority to Chinese Patent Application No. 201811604369.8 filed on Dec. 26, 2018. Both of the aforementioned applications are hereby incorporated by reference in their entireties.

TECHNICAL FIELD

Embodiments disclosed in this application relate to the field of storage technologies, and more specifically, to a test system for a memory card.

BACKGROUND

A memory card is an independent storage medium used in an intelligent device, such as a smartphone, a digital camera, or a portable computer, and is usually in a form of a card. Before being inserted into the intelligent device, the memory card needs to be tested for compatibility, for example, information identification, reading, and hot swapping.

In a current test method, a computer host is used for testing, and only a single memory card can be tested at a time. This results in a large area occupied by a test device, high costs of the test device, and low test efficiency.

SUMMARY

According to embodiments of this application, this application provides a test system for a memory card, to resolve the foregoing problem.

According to this application, a test system for a memory card is provided. The test system includes: a first circuit board, where one side of the first circuit board is provided with a plurality of contact groups spaced apart from each other along a row direction, and the other side of the first circuit board is provided with a slot disposed along the row direction; and a second circuit board, where the second circuit board is provided with a test circuit, and the second circuit board is inserted into the slot along a direction perpendicular to the first circuit board, and provides a test signal to the contact groups.

This application has the following beneficial effects: A dedicated test system is designed by using a first circuit board and a second circuit board and disposing a test circuit on the second circuit board, and a computer host is not required. In addition, the second circuit board is provided with a plurality of test circuits, so that the test system can simultaneously test a plurality of to-be-tested memory cards. With the first circuit board, more to-be-tested memory cards can be simultaneously tested, thereby improving one-time test efficiency and reducing test costs.

BRIEF DESCRIPTION OF DRAWINGS

FIG. 4b is an enlarged view of a part A in FIG. 4a;

DESCRIPTION OF EMBODIMENTS

Some terms used throughout this specification and the claims refer to specific components. As can be appreciated by a person skilled in the art, electronic device manufacturers may use different names to refer to a same component. Components are distinguished herein by functions instead of by names. In the following specification and the claims, the term "including/comprising" is an open-ended qualifying word, and therefore should be construed as meaning "including/comprising but not limited to . . . ". In addition, the term "coupled" is intended to mean an indirect electrical coupling or a direct electrical coupling. Therefore, when one device is coupled to another device, the coupling may be a direct electrical coupling or an indirect electrical coupling implemented by a third device and a coupling portion.

Figure 1:
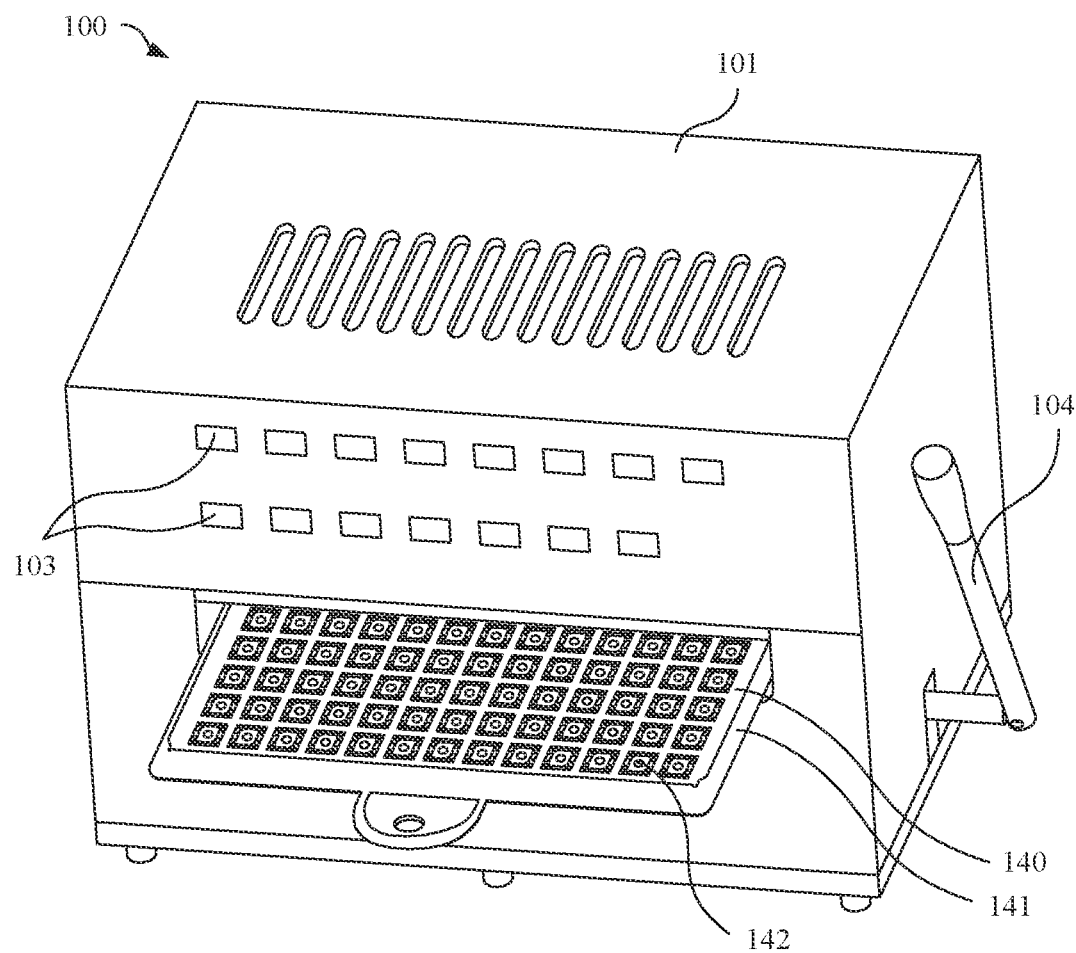
FIG. 1 is a schematic diagram of a test system for a memory card according to an embodiment of this application.
Figure 2:
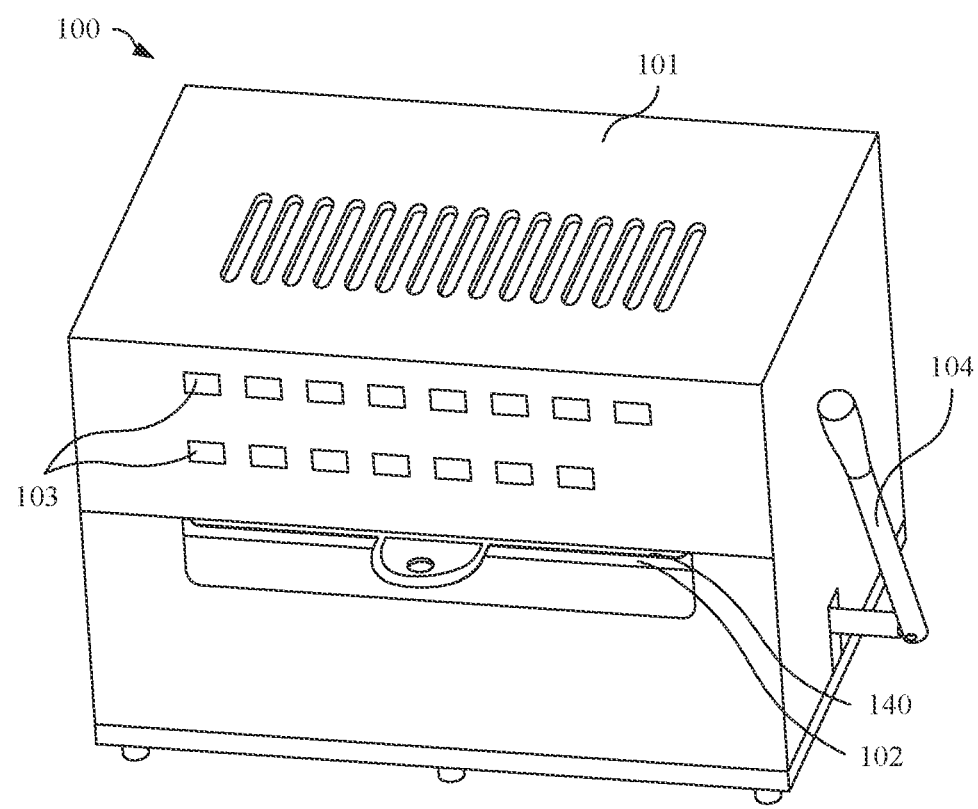
FIG. 2 is a schematic diagram of a test system for a memory card according to an embodiment of this application.
Figure 3:
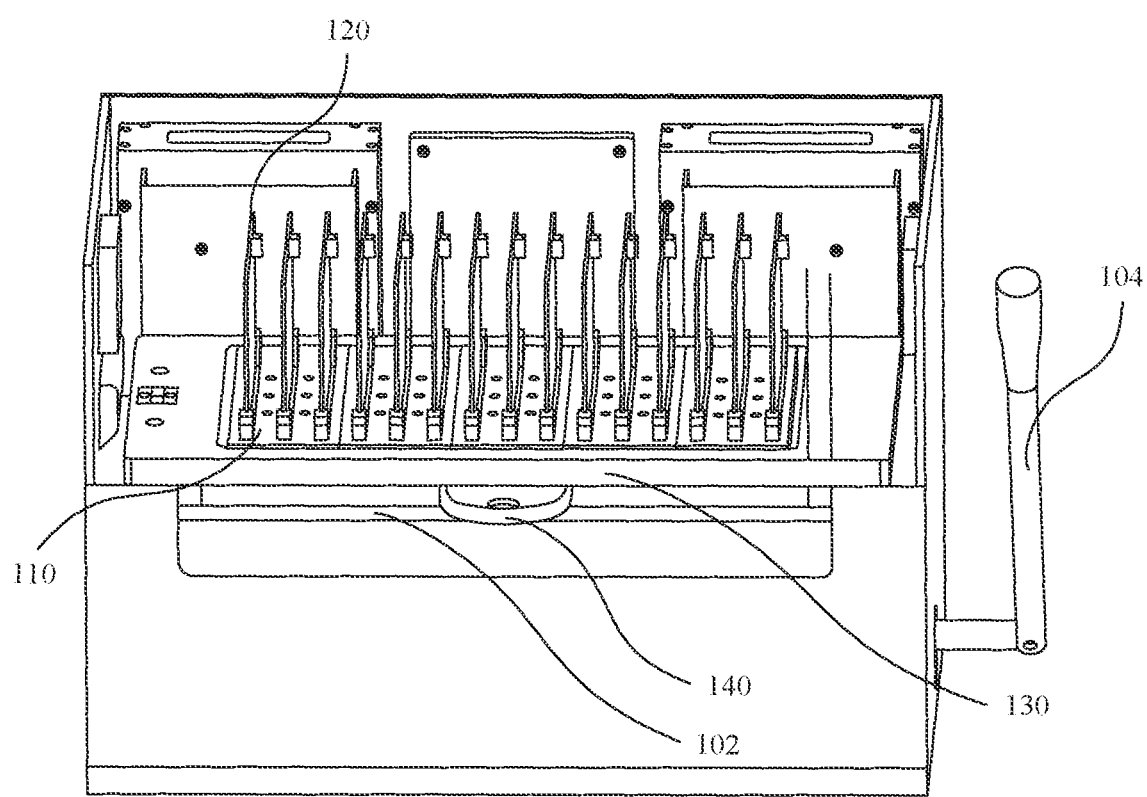
FIG. 3 is a schematic diagram of a test system for a memory card according to an embodiment of this application.

FIG. 1 to FIG. 3 are each a schematic diagram of a test system for a memory card according to an embodiment of this application. The test system 100 is configured to test a memory card. The memory card includes but is not limited to an SD card (Secure Digital Memory Card), a TF card (Trans-flash Card), an MMC card (Multi-MediaCard), an eMMC card (Embedded Multi-Media Card), an EMCP (Embedded Multi-Chip Package) card, and a CF (Compact Flash) card.

The test system 100 includes a housing 101 and a first circuit board 110 and a second circuit board 120 that are accommodated in the housing 101. The second circuit board 120 is configured to provide a test signal. In this embodiment, the test system 100 includes a plurality of first circuit boards 110 and a plurality of second circuit boards 120, and each first circuit board 110 is provided with a plurality of second circuit boards 120. Specifically, as shown in FIG. 3 the test system 100 includes five first circuit boards 110 and 15 second circuit boards 120, and each first circuit board 110 is provided with three second circuit boards 120, that is, each first circuit board 110 corresponds to three second circuit boards 120. The test system 100 further includes a plurality of power supplies (not shown in the figure) configured to supply power to the second circuit board 120, so that the second circuit board 120 provides the test signal. Each power supply is electrically connected to at least one second circuit board 120. In an example in which the test system 100 includes 15 second circuit boards 120, two power supplies may be disposed to supply power to the 15 second circuit boards 120. One of the power supplies is electrically connected to eight second circuit boards 120 to supply power, and the other power supply is electrically connected to seven second circuit boards 120 to supply power. In another example, alternatively, one power supply may be disposed for every five second circuit boards 120 to supply power.

Figure 4A:
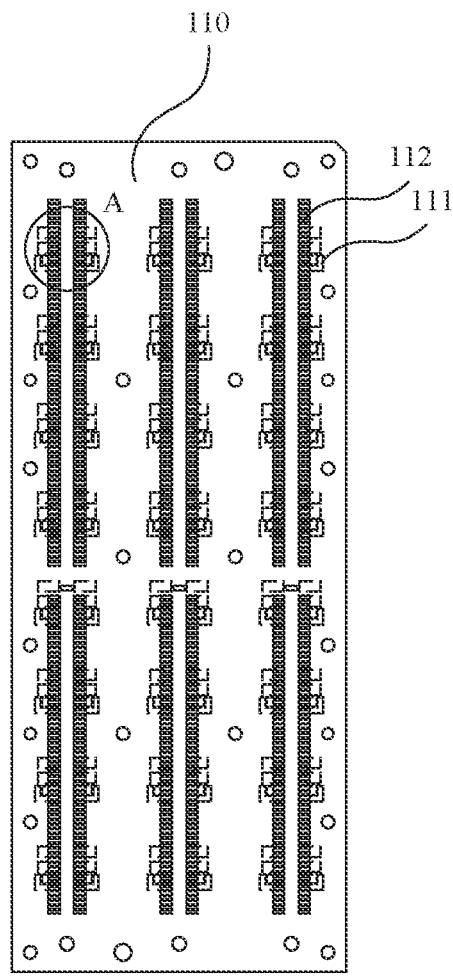
FIG. 4a is a front view of a first circuit board in FIG. 1 according to an embodiment of this application.
Figure 4B:
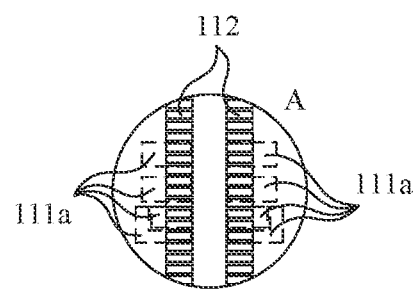

With reference to FIG. 4*a* and FIG. 4*b*, one side of the first circuit board 110 is provided with a plurality of contact groups 111 spaced apart from each other along a row direction, and the other side of the first circuit board 110 is provided with slots 112 disposed along the row direction. The contact group 111 is configured to establish an electrical connection between the first circuit board 110 and a to-be-tested memory card, and the slot 112 is configured to dispose the second circuit board 120 on the first circuit board 110. When the test system 100 operates, the second circuit board 120 provides the test signal to the to-be-tested memory card through the first circuit board 110. In an embodiment, as shown in FIG. 4*a* and FIG. 4*b*, one side of the first circuit board 110 is provided with eight contact groups 111 along the row direction.

Further, the first circuit board 110 is provided with a plurality of rows of contact groups 111 spaced apart from each other along a column direction, and each row of contact groups 11 is correspondingly provided with one slot 112 and one second circuit board 120. In an embodiment, the first circuit board 110 is provided with three rows of contact groups 111 spaced apart from each other along the column direction. It should be noted that the row direction and the column direction of the first circuit board 110 are perpendicular to each other. In an example, as shown in FIG. 4*a* and FIG. 4*b*, the row direction of the first circuit board 110 is a length direction of the first circuit board 110, and the column direction of the first circuit board 110 is a width direction of the first circuit board 110. One side of the first circuit board 110 is provided with a plurality of contact groups 111 along the row direction and a plurality of contact groups 111 along the column direction. In other words, the contact groups 111 on the first circuit board 110 are arranged in an array in the length direction and the width direction of the first circuit board 110.

Each contact group 111 includes a plurality of sub-contacts 111*a*. A quantity of the sub-contacts 111*a* in the contact group 111 is the same as a quantity of sub-contacts on the to-be-tested memory card. In addition, a shape of the sub-contact 111*a* in the contact group 1*l* corresponds to a shape of the sub-contact on the to-be-tested memory card, so that the to-be-tested memory card can be electrically connected to the sub-contact in the contact group. In an example, the shape of the sub-contact 111*a* in the contact group 111 is the same as the shape of the sub-contact on the to-be-tested memory card, so that the to-be-tested memory card can be better electrically connected to the sub-contact 111*a* in the contact group 111 when the to-be-tested memory card faces the contact group 111.

In an embodiment, the to-be-tested memory card uses an eMMC protocol. In other words, the to-be-tested memory card is a memory card of an eMMC protocol.

Figure 5:
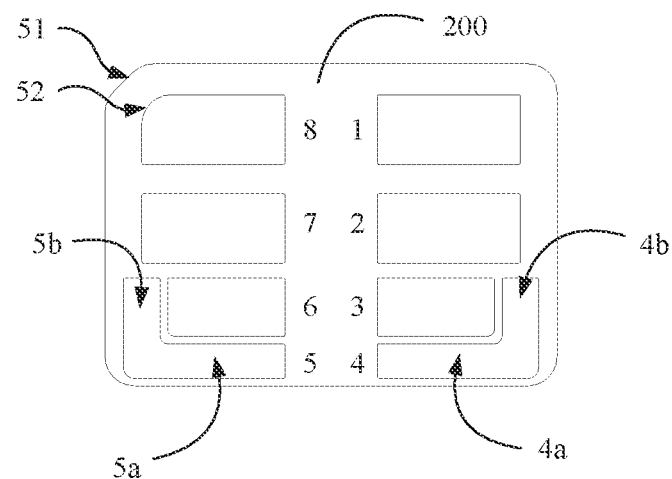
FIG. 5 is a schematic diagram of a to-be-tested memory card according to an embodiment of this application.

A memory card of the eMMC protocol, for example, an NM card (multimedia memory card), is used as an example below for description. In an example, as shown in FIG. 5, the memory card 200 of the eMMC protocol includes eight sub-contacts. A power sub-contact is configured to receive an externally input 3.3 V power supply, and a transformer power supply is configured to convert 3.3 V into 1.8 V. It can be understood that the sub-contacts are insulated from each other.

As shown in FIG. 5, the eight sub-contacts are denoted by numbers 1 to 8. The eight sub-contacts are arranged in four rows and two columns by using a long side as a row and a short side as a column of the memory card 10 of the eMMC protocol. The eight sub-contacts include a first sub-contact, a second sub-contact, a third sub-contact, and a fourth sub-contact that are sequentially arranged in a first column, and a fifth sub-contact, a sixth sub-contact, a seventh sub-contact, and an eighth sub-contact that are arranged in reverse order in a second column.

Optionally, the eighth sub-contact corresponds to a first chamfered portion 51, and a corner that is of the eighth sub-contact and that corresponds to the first chamfered portion 51 is set as a second chamfered portion 52.

Optionally, the fourth sub-contact includes an L-shaped first body 4*a* and a first extension portion 4*b*, and the first extension portion 4*b* extends between the third sub-contact and an adjacent short side. The fifth sub-contact includes an L-shaped second body 5*a* and a second extension portion 5*b*, and the second extension portion 5*b* extends between the sixth sub-contact and an adjacent short side.

In this example, the eight sub-contacts include a 3.3 V power contact (VCC), a ground contact (GND), a clock contact (CLK), a command contact (CMD), and four data contacts (D0 to D3). In this example, the eight sub-contacts are set as follows:

| Sub-contact number | Definition |
|---|---|
| 1 | D1 |
| 2 | CMD |
| 3 | GND |
| 4 | D3 |
| 5 | D2 |
| 6 | VCC |
| 7 | D0 |
| 8 | CLK |

The 3.3 V power contact (VCC) is configured to receive a third voltage V3 output by a third transformer circuit 1225. A standard eMMC protocol needs to provide two power inputs, namely, VCC (3.3 V) and VCCQ (3.3 V or 1.8 V), and eight data pins. To reduce an area of a memory card, eight interface contacts are disposed for the NM card provided in this embodiment, and there is only a VCC pin. Therefore, only the 3.3 V power input is reserved, and only four data interface contacts are disposed.

To test the memory card 200 of the eMMC protocol, correspondingly, each contact group 111 includes eight sub-contacts 111*a*. Shapes of the sub-contacts 111*a* in the contact group 111 are the same as shapes of the eight sub-contacts of the memory card 200 of the eMMC protocol. For details, refer to the foregoing description about the shapes of the eight sub-contacts of the memory card of the eMMC protocol. It should be noted that the eighth sub-contact of the memory card of the eMMC protocol is provided with the chamfered portion. To better connect the memory card of the eMMC protocol to the contact group 111, in FIG. 4*a* and FIG. 4*b*, a sub-contact 111*a* in the contact group 111 corresponding to the eighth sub-contact of the memory card of the eMMC protocol is provided no chamfered portion.

As shown in FIG. 4*a* and FIG. 4*b*, the slot 112 is disposed opposite to the contact groups 111, and each sub-contact 111*a* of the contact group 111 is partially disposed overlapping the slot 112, to reduce wiring on the first circuit board 110.

As shown in FIG. 3, the second circuit board 120 is inserted into the slot 112 along a direction perpendicular to the first circuit board 110.

Figure 6:
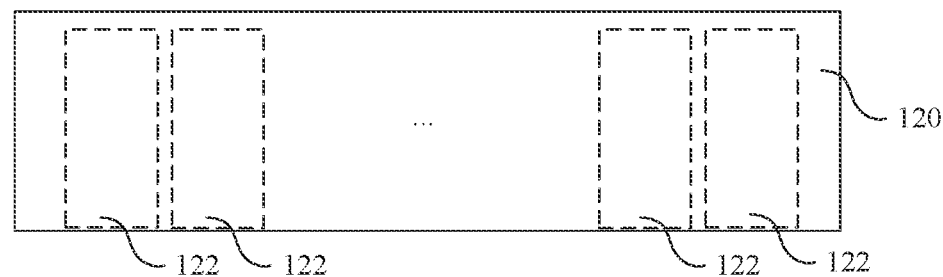
FIG. 6 is a schematic diagram of a second circuit board in FIG. 1 according to an embodiment of this application.

With reference to FIG. 6, the second circuit board 120 is provided with a test circuit 122. In this embodiment, the second circuit board 120 is provided with a plurality of test circuits 122. When the test system 100 works, the test circuit 122 provides a test signal to the to-be-tested memory card by using the contact groups 111, that is, the second circuit board 120 transfers the test signal to the contact groups 111. Further, the second circuit board 120 is provided with a plurality of test circuits 122 of a quantity corresponding to a quantity of contact groups III in a corresponding row, and the test circuits 122 are independent of each other, and respectively provide the test signal to the corresponding contact groups 1. In an embodiment, as shown in FIG. 4a and FIG. 4b, one side of the first circuit board 110 is provided with eight contact groups 111 along the row direction, and correspondingly, the second circuit board 120 is provided with eight test circuits 122.

That the second circuit board 120 is provided with eight test circuits 122 is used as an example below for description.

Figure 7:
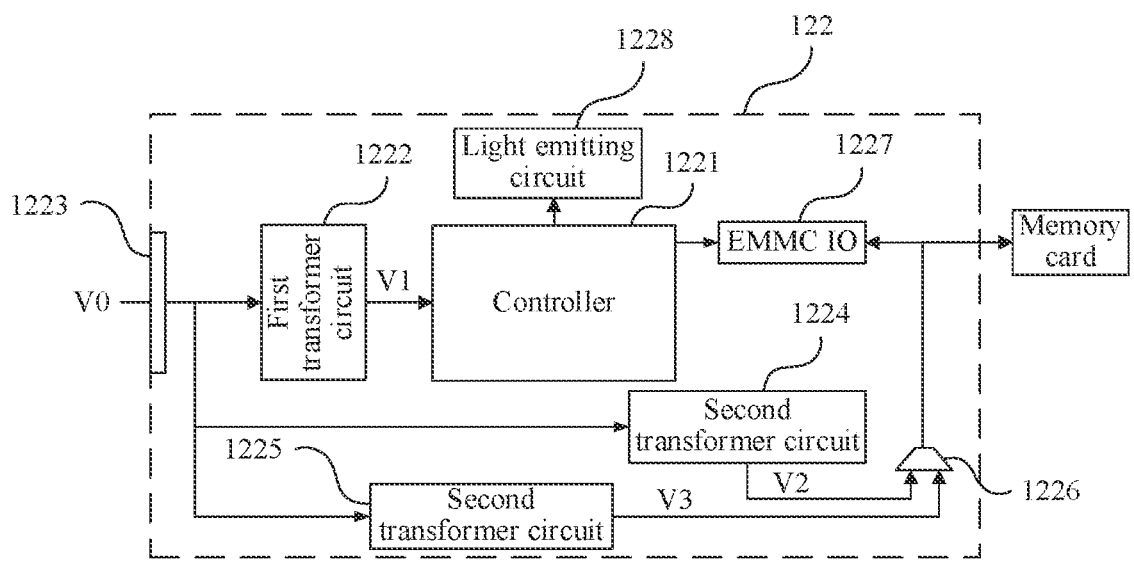
FIG. 7 is a schematic circuit diagram of a test circuit on a second circuit board in FIG. 1 according to an embodiment of this application.

FIG. 7 is a schematic circuit diagram of a test circuit according to an embodiment of this application. Each test circuit 122 includes a controller 1221 configured to generate a test signal. The controller 1221 separately performs a write operation and a read operation on a corresponding to-be-tested memory card, and writes data and reads data for verification. The controller 1221 further generates a test result based on a verification result, and writes the test result into a specified area of the to-be-tested memory card. In an example, the controller 1221 may be implemented by using an integrated chip. For example, the controller 1221 may be a DM8371 controller.

Figure 8:
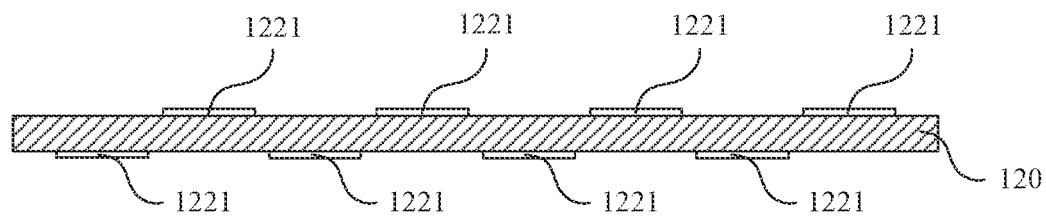
FIG. 8 is a top view of a second circuit board in FIG. 1 according to another embodiment of this application.
Figure 9:
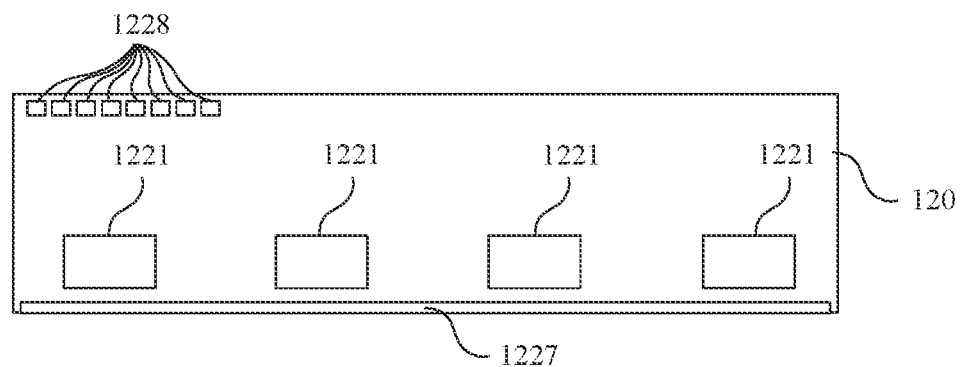
FIG. 9 is a front view of a second circuit board in FIG. 1 according to another embodiment of this application.

In addition, FIG. 8 and FIG. 9 are a top view and a front view of a second circuit board respectively according to an embodiment of this application. Controllers 1221 in a plurality of test circuits 122 are alternately disposed on two opposite sides of the second circuit board 120. It should be noted that eight test circuits 122 are shown on the second circuit board 120 in FIG. 8, that is, controllers 1221 in the eight test circuits 122 are alternately disposed on the two opposite sides of the second circuit board 120. However, a person skilled in the art may understand that, based on a size of the second circuit board 120, another quantity of test circuits 122 may be disposed. For example, four test circuits 122 may be disposed. In this case, the four test circuits 122 are alternately disposed on the two opposite sides of the second circuit board 120, so that the size of the second circuit board 120 becomes small.

As shown in FIG. 7, the test circuit 122 further includes a first transformer circuit 1222, a second transformer circuit 1224, a third transformer circuit 1225, and a selection circuit 1226.

An input end of the first transformer circuit 1222 is coupled to a power interface 1223, and an output end of the first transformer circuit 1222 is coupled to the controller 1221, to convert an external voltage V0 into a first voltage V1 and provide the first voltage V1 to the controller 1221. The controller 1221 operates under action of the first voltage V1. Input ends of the second transformer circuit 1224 and the third transformer circuit 1225 are both coupled to the power interface 1223, and output ends of the second transformer circuit 1224 and the third transformer circuit 1225 are coupled to the to-be-tested memory card by using the selection circuit 1226. The second transformer circuit 1224 converts the external voltage V0 into a second voltage V2, the third transformer circuit 1225 converts the external voltage V0 into the third voltage V3, and the second voltage V2 or the third voltage V3 is provided to the to-be-tested memory card by using the selection circuit 1226. The to-be-tested memory card operates under action of the second voltage V2 or the third voltage V3.

In the foregoing manner, the external voltage V0 is converted into the second voltage V2 and the third voltage V3 by using the two transformer circuits, respectively, and then the second voltage V2 and the third voltage V3 are selected by using the selection circuit 1226 to be provided for the to-be-tested memory card, so that the to-be-tested memory card works. In this way, memory cards with different working voltages can all be tested, thereby increasing types of to-be-tested memory cards.

In an example, the first voltage V1 is 1.2 V, the second voltage V2 is 1.8 V, and the third voltage V3 is 3.3 V.

An example in which the to-be-tested memory card is a memory card of an eMMC protocol is still used for description. As shown in FIG. 7, the test circuit 122 further includes an eMMC 10 pin 1227. The eMMC IO pin 1227 is coupled to the controller 1221 and executes the eMMC protocol. The eMMC 10 pin 1227 is electrically connected to the sub-contact 111a of the to-be-tested memory card by using the contact group 111 on the first circuit board 110, so that the to-be-tested memory card receives the test signal for testing.

In this embodiment, in addition, as shown in FIG. 9, one end of the second circuit board 120 is provided with eMMC IO pins 1227 of the plurality of test circuits 122. As described above, the second circuit board 120 is inserted into the slot 112 along a direction perpendicular to the first circuit board 110. In this case, the eMMC 10 pin 1227 of the test circuit 122 is inserted into the slot 112. Based on a correspondence between the slot 112 and the contact groups 111, the eMMC pin 1227 of the test circuit 122 is electrically connected to the sub-contact 111a of the to-be-tested memory card, so that when the test system 100 works, the to-be-tested memory card receives the test signal from the second circuit board 120 for testing.

As shown in FIG. 7, the test circuit 122 further includes a light emitting circuit 1228. The light emitting circuit 1228 is coupled to the controller 1221. The light emitting circuit 1228 is configured to indicate a test status of the to-be-tested memory card, for example, indicate whether a test of the to-be-tested memory card is normal. When the light emitting circuit 1228 emits light, it indicates that the to-be-tested memory card is being tested; and when the light emitting circuit 1228 emits no light, it indicates that the to-be-tested memory card is not tested, that is, a test fault occurs. In an embodiment, the light emitting circuit 1228 includes an LED lamp. In addition, as shown in FIG. 9, light emitting circuits 1228 in the plurality of test circuits 122 are disposed side by side and disposed on one end of the second circuit board 120, and the light emitting circuits 1228 and the controller 1221 are disposed opposite to each other at two ends of the second circuit board 120.

It should be noted that in this application, a location of each circuit part in the test circuit 122 on the second circuit board 120 is not limited. Therefore, a location of each circuit part in the test circuit 122 on the second circuit board 120 is not specifically shown in FIG. 8 and FIG. 9.

As shown in FIG. 1 to FIG. 3, the test system 100 further includes a first tray assembly 140 and a third circuit board 130. The first tray assembly 140 carries a plurality of to-be-tested memory cards arranged in an array along the row direction and the column direction. In an embodiment, the first tray assembly 140 is movable relative to the third circuit board 130. When the test system 100 works, the first tray assembly 140 moves toward a direction in which the third circuit board 130 is located, so that a to-be-tested memory card carried on the first tray assembly 140 comes into contact with the third circuit board 130, as shown in FIG. 2. Further, the test circuit 122 on the second circuit board 120 provides the test signal to the to-be-tested memory card by using the first circuit board 110 and the third circuit board 130, to perform a test. When the test system 100 does not work, the first tray assembly 140 moves away from the direction in which the third circuit board 130 is located, so that the to-be-tested memory card carried on the first tray assembly 140 does not come into contact with the third circuit board 130, as shown in FIG. 1, to unload the to-be-tested memory card carried on the first tray assembly 140. There may be different embodiments in which the first tray assembly 140 is movable relative to the third circuit board 130. For example, the test system 100 includes a lifting mechanism (not shown in the figure), and the lifting structure is configured to move, when the test system 100 is required to work, the first tray assembly 140 toward the direction in which the third circuit board 130 is located, or move, when the test system 100 is not required to work, the first tray assembly 140 away from the direction in which the third circuit board 130 is located. The lifting mechanism includes a motor. The motor may be manually, pneumatically, or electrically controlled.

Specifically, as shown in FIG. 1 to FIG. 3, the test system 100 further includes a support plate 102 for placing the first tray assembly 140. The support plate 102 is disposed in the housing 101. Because the first tray assembly 140 is movable relative to the third circuit board 130, in an example, the support plate 102 is movable relative to the third circuit board 130.

Specifically, in an embodiment, the support plate 102 is connected to a lifting mechanism, and the lifting mechanism is disposed below the support plate 102. In an example, the lifting mechanism includes a motor, the motor may be manual, and as shown in FIG. 1 to FIG. 3, the motor is manually operated by using a motor handle 104, to move the first tray assembly 140 relative to the third circuit board 130. In another embodiment, the motor may be pneumatically or electrically controlled. This application is not limited thereto.

The third circuit board 130 is provided with a plurality of contact groups (not shown in the figure) arranged in an array along the row direction and the column direction. Each contact group includes sub-contacts of a quantity corresponding to a quantity of the sub-contacts 111a in the contact group 111. The sub-contacts protrude from two sides of the third circuit board 130. The third circuit board 130 is supported between the first circuit board 110 and the first tray assembly 140, and then electrically connects a sub-contact 111a on each to-be-tested memory card to a corresponding sub-contact 111a in the contact group 111 by using the contact group.

When the test system 100 works, the lifting mechanism pushes the support plate 102 to move toward the third circuit board 130, so that a to-be-tested memory card in the first tray assembly 140 on the support plate 102 is close to the third circuit board 130, and further, the to-be-tested memory card in the first tray assembly 140 comes into contact with a contact group on the third circuit board 130. In this way, the to-be-tested memory card is electrically connected to the first circuit board 110 on the second circuit board 120 through a connection between sub-contacts in the contact group and the sub-contacts 111a in the contact group 111. Further, the test circuit 122 of the second circuit board 120 provides the test signal to the to-be-tested memory card when the test system 100 is operating.

As shown in FIG. 1, two opposite sides of the first tray assembly 140 are each provided with a limiting portion 141. Correspondingly, an adapting portion (not shown) that matches the limiting portion 141 is disposed in the housing 101, so that the first tray assembly 140 is inserted into the housing 101.

The first tray assembly 140 is provided with a plurality of first card slots 142 arranged in an array along the row direction and the column direction. A size of the first card slot 142 is consistent with a size of the to-be-tested memory card, so that the first card slot 142 can accommodate the to-be-tested memory card. In an embodiment, as described above, the test system 100 includes 15 second circuit boards 120, and the second circuit board 120 is each provided with eight test circuits 122. In this case, the first tray assembly 140 is provided with 15×8 first card slots 142. In other words, each row is provided with 15 first card slots 142, and each column is provided with eight first card slots 142. It should be noted that the row direction and the column direction are respectively a length direction and a width direction of the first tray assembly 140.

Figure 10:
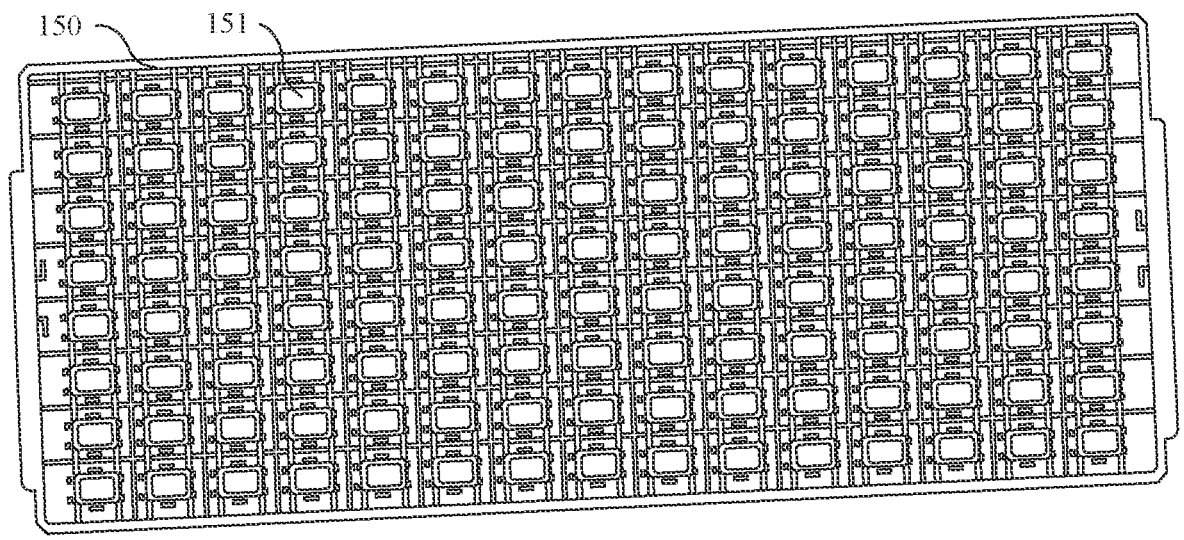
FIG. 10 is a schematic diagram of a second tray assembly according to an embodiment of this application.

As shown in FIG. 10, the test system 100 further includes a second tray assembly 150. The second tray assembly 150 is independent of the first tray assembly 140. The second tray assembly 150 is configured to arrange the plurality of to-be-tested memory cards onto the first tray assembly 140 at a time, so that the first tray assembly 140 carries the plurality of to-be-tested memory cards arranged in an array along the row direction and the column direction.

The second tray assembly 150 is provided with a plurality of second card slots 151 arranged in an array along the row direction and the column direction. A size of the second card slot 151 is consistent with a size of the to-be-tested memory card, so that the second card slot 151 can accommodate the to-be-tested memory card. The plurality of second card slots 151 that are arranged in an array along the row direction and the column direction and that are disposed on the second tray assembly 150 are consistent with the plurality of first card slots 142 that are arranged in an array along the row direction and the column direction and that are disposed on the first tray assembly 140, so that the second tray assembly 150 is flipped to arrange to-be-tested memory cards thereon onto the first tray assembly 140 at a time. In an embodiment, as described above, the test system 100 includes 15 second circuit boards 120, and the second circuit board 120 is each provided with eight test circuits 122. In this case, the first tray assembly 140 is provided with 15×8 first card slots 142. In other words, each row is provided with 15 first card slots 142, and each column is provided with eight first card slots 142. Further, the second tray assembly 150 is provided with 15×8 second card slots 151. In other words, each row is provided with 15 second card slots 151, and each column is provided with eight second card slots 151. It should be noted that the row direction and the column direction are respectively a length direction and a width direction of the first tray assembly 140 or the second tray assembly 150.

Based on a layout of the sub-contacts on the to-be-tested memory card, the to-be-tested memory cards on the second tray assembly 150 may be arranged onto the first tray assembly 140 at a time in different flipping manners. In an example, the second tray assembly 150 is flipped along the column direction to arrange a plurality of to-be-tested memory cards on the second tray assembly 150 onto the first tray assembly 140 at a time. In another example, the second tray assembly 150 is flipped in the row direction to arrange a plurality of to-be-tested memory cards on the second tray assembly 150 onto the first tray assembly 140 at a time. It should be noted that, as shown in FIG. 10, flipping along the column direction is flipping left and right, and flipping along the row direction is flipping back and forth. When the to-be-tested memory card is the memory card in FIG. 5, when the memory card is arranged on the second tray assembly 150, when the sub-contacts of the memory card face into the second card slot 151, after the arrangement, when the first sub-contact is located on a left side of the eighth sub-contact, the second tray assembly 150 is flipped along the column direction, and the to-be-tested memory cards on the second tray assembly 150 are arranged onto the first tray assembly 140 at a time.

As shown in FIG. 1 and FIG. 2, the test system 100 further includes an ammeter (not shown) and a display 103 thereof. The ammeter may be disposed on the first circuit board 110, or may be disposed on the second circuit board 120. The display 103 of the ammeter is configured to display a current, a voltage, or another test result of each second circuit board 120 testing a corresponding to-be-tested memory card. In this embodiment, when a quantity of second circuit boards 120 is 15, a quantity of ammeters is also 15. Correspondingly, a quantity of displays of the ammeters is also 15. In this embodiment, the display 103 of the ammeter is disposed on a front end surface of the housing 101.

In this application, the dedicated test system 100 is designed by using the first circuit board 110 and the second circuit board 120 and disposing the test circuit 122 on the second circuit board 120, and a computer host is not required. In addition, with the plurality of test circuits 122 on the second circuit board 120, the test system 100 can simultaneously test a plurality of to-be-tested memory cards. With the first circuit board 110, more to-be-tested memory cards can be simultaneously tested, thereby improving one-time test efficiency.

The following describes a working procedure of the test system 100 in this application with reference to the foregoing embodiments and FIG. 1 to FIG. 10.

First, a to-be-tested memory card is placed on the second tray assembly 150, and the second tray assembly 150 is flipped on the first tray assembly 140, so that the to-be-tested memory card is arranged onto the first tray assembly 140.

Subsequently, the first tray assembly 140 is placed on the support plate 102 and inserted into a lower part of the third circuit board 130, and the motor is operated by using the motor handle 104, so that the first tray assembly 140 moves toward the direction in which the third circuit board 130 is located, to come into contact with a contact on the third circuit board 130.

Subsequently, the test system 100 is powered on. In an example, the test system 100 may further include an infrared sensor, configured to sense whether the first tray assembly 140 is inserted in place. If the first tray assembly 140 is inserted in place, the test circuit 122 on the second circuit board 120 is powered on and starts to operate. In this case, the controller 1221 separately performs a write operation and a read operation on the corresponding to-be-tested memory card, and writes data and reads data for verification. The controller 1221 further generates a test result based on a verification result, and writes the test result into a specified area of the to-be-tested memory card. At the same time, the display 103 of the ammeter displays a test current, voltage, and the like of the corresponding memory card. If the first tray assembly 140 is not inserted in place, the test circuit 122 on the second circuit board 120 does not work. In this case, no parameter is displayed on the display 103 of the ammeter.

It is readily apparent to a person skilled in the art that numerous modifications and changes can be made to the apparatus and method while maintaining teachings of this application. Therefore, the foregoing disclosure should be considered to be limited only by the scope of the appended claims.

The invention claimed is:

1. A test system for a memory card, wherein the test system comprises:
   a first circuit board comprising:
      a first surface comprising a plurality of first contact groups spaced apart from each other along a row direction and forming a first row of contact groups; and
      a second surface comprising a first slot along the row direction, wherein the first surface and the second surface are opposite surfaces of the first circuit board; and
   a second circuit board comprising a test circuit and inserted into the first slot along a plane direction perpendicular to the first surface of the first circuit board,
   wherein the second circuit board inserted into the first slot on the second surface of the circuit board is configured to provide a test signal to the first row of contact groups on the first surface of the first circuit board.

2. The test system of claim 1, wherein the first circuit board further comprises:
   a plurality of rows of contact groups and comprising the first row, wherein the rows are spaced apart from each other along a column direction; and
   a plurality of slots comprising the first slot,
   wherein the test system further comprises a plurality of second circuit boards including the second circuit board, and
   wherein each second circuit board of the second circuit boards is inserted into a respective slot of the slots.

3. The test system of claim 2, wherein each second circuit board of the second circuit boards comprises respective test circuits, wherein a quantity of the respective test circuits of a respective second circuit board corresponds to a quantity of respective first contact groups in a respective row corresponding to the respective second circuit board, wherein each of the respective test circuits is independent of each other of the respective test circuits, and wherein each second circuit board of the second circuit boards is configured to provide a respective test signal to first contact groups corresponding to the second circuit board.

4. The test system of claim 3, wherein the respective test circuits comprise controllers, and wherein each of the respective test circuits comprises one controller configured to generate the respective test signal.

5. The test system of claim 4, wherein the controllers are alternately disposed on two sides of the second circuit board.

6. The test system of claim 4, wherein each contact group of the first contact groups comprises a plurality of first sub-contacts on the second surface, wherein, for each respective first contact group of the first contact groups, a quantity of the first sub-contacts in the first contact group is the same as a quantity of second sub-contacts on a to-be-tested memory card, wherein the test system further comprises:
   a first tray assembly configured to carry a plurality of to-be-tested memory cards arranged in an array along the row direction and the column direction; and a third circuit board comprising a plurality of second contact groups arranged in an array along the row direction and the column direction, wherein each contact group of the second contact groups comprises third sub-contacts, wherein a quantity of the third sub-contacts corresponds to a quantity of the first sub-contacts, wherein the third sub-contacts protrude from two sides of the third circuit board, wherein the third circuit board is supported between the first circuit board and the first tray assembly, and wherein the third circuit board is configured to electrically couple the second sub-contacts on the to-be-tested memory cards to respective sub-contacts of the first sub-contacts.

7. The test system of claim 6, wherein the first tray assembly is movable relative to the third circuit board.

8. The test system of claim 6, wherein the test system further comprises a second tray assembly that is independent of the first tray assembly and that is configured to arrange the plurality of to-be-tested memory cards onto the first tray assembly such that the first tray assembly carries the plurality of to-be-tested memory cards arranged in an array along the row direction and the column direction.

9. The test system of claim 4, wherein each of the controllers is configured to:
separately perform a write operation and a read operation on a corresponding to-be-tested memory card;
write data and read data for verification;
generate a test result based on a verification result; and
write the test result into a specified area of the to-be-tested memory card.

10. The test system of claim 4, further comprising a power interface, wherein each of the respective test circuits further comprises a first transformer circuit comprising a first input end and a first output end, wherein the first input end is coupled to the power interface, and wherein the first output end is coupled to a respective controller of the controllers, and wherein the first transformer circuit of each of the respective test circuits is configured to convert an external voltage into a first voltage and to provide the first voltage to the respective controller.

11. The test system of claim 10, wherein each of the respective test circuits further comprises:
a selection circuit;
a second transformer circuit comprising a second input end coupled to the power interface and a second output end coupled to the to-be-tested memory card using the selection circuit, wherein the second transformer circuit is configured to convert the external voltage into a second voltage and provide the second voltage to the to-be-tested memory card using the selection circuit; and
a third transformer circuit comprising a third input end coupled to the power interface and a third output end coupled to the to-be-tested memory card using the selection circuit, wherein the third transformer circuit is configured to convert the external voltage into a third voltage and provide the third voltage to the to-be-tested memory card using the selection circuit.

12. The test system of claim 1, wherein the test system further comprises:
a plurality of second circuit boards including the second circuit board; and
a plurality of power supplies electrically coupled to at least one respective second circuit board of the second circuit boards and configured to supply power to the at least one respective second circuit board to enable the at least one respective second circuit board to provide the test signal.

13. The test system of claim 1, wherein the test circuit further comprises a light-emitting circuit.

14. The test system of claim 13, wherein the light-emitting circuit is configured to indicate a test status of a to-be-tested memory card.

15. The test system of claim 6, wherein a shape of at least one first sub-contact of the first sub-contacts in the first contact group is different than a shape of at least one second sub-contact of the first sub-contacts in the first contact group.

16. The test system of claim 15, wherein the at least one first sub-contact comprises an L-shaped first body.

17. The test system of claim 16, wherein the at least one first sub-contact further comprises an extension portion.

18. The test system of claim 15, wherein the at least one first sub-contact on the second surface overlaps the first slot on the first surface.

19. The test system of claim 11, wherein the selection circuit is configured to select either the first voltage or the second voltage to provide to the to-be-tested memory card.

20. The test system of claim 19, wherein the selection circuit is configured to select the first voltage when the to-be-tested memory card is a first memory card, and wherein the selection circuit is configured to select the second voltage when the to-be-tested memory card is a second memory card.

* * * * *